(12) United States Patent
Mamadou et al.

(10) Patent No.: US 9,075,117 B2
(45) Date of Patent: Jul. 7, 2015

(54) METHOD FOR CALIBRATING AN ELECTROCHEMICAL BATTERY

(75) Inventors: Kelli Mamadou, Fort de France (FR); Arnaud DeLaille, Bassens (FR)

(73) Assignee: Commissariat a L'Energies Atomique et aux Energies Alternatives, Paris (FR)

( * ) Notice: Subject to any disclaimer, the term of this patent is extended or adjusted under 35 U.S.C. 154(b) by 750 days.

(21) Appl. No.: 13/381,308

(22) PCT Filed: Jun. 30, 2010

(86) PCT No.: PCT/EP2010/059287
§ 371 (c)(1),
(2), (4) Date: Jan. 3, 2012

(87) PCT Pub. No.: WO2011/000872
PCT Pub. Date: Jan. 6, 2011

(65) Prior Publication Data
US 2012/0109557 A1    May 3, 2012

(30) Foreign Application Priority Data

Jul. 1, 2009    (FR) .................................... 09 03258

(51) Int. Cl.
| | |
|---|---|
| *G01R 31/36* | (2006.01) |
| *H02J 7/00* | (2006.01) |
| *B60L 11/18* | (2006.01) |
| *G06F 17/17* | (2006.01) |
| *H01M 10/42* | (2006.01) |
| *G01R 35/00* | (2006.01) |

(Continued)

(52) U.S. Cl.
CPC ............... *G01R 31/3651* (2013.01); *H02J 7/00* (2013.01); *B60L 11/18* (2013.01); *G06F 17/17* (2013.01); *G01R 31/36* (2013.01); *G01R 35/005* (2013.01); *H01M 10/42* (2013.01)

(58) Field of Classification Search
CPC ......... G01R 31/36; G06F 17/17; B60L 11/18; H01M 10/48; H02J 7/00; Y02T 10/7044; Y02T 10/7011
USPC .............................................. 702/63; 320/132
See application file for complete search history.

(56) References Cited

U.S. PATENT DOCUMENTS 5,650,712 A    7/1997    Kawai et al.
(Continued)

FOREIGN PATENT DOCUMENTS

| DE | 10 2008 004 368 A | 2/2009 |
|---|---|---|
| JP | 10-289734 A | 10/1998 |
| WO | WO 02/42786 A | 5/2002 |

OTHER PUBLICATIONS

Durr, Matthias, Dynamic model of a lead acid battery for use in a domestic fuel cell system, Feb. 2006, Science Direct, p. 7.*

(Continued)

*Primary Examiner* — John Breene
*Assistant Examiner* — Eyob Hagos
(74) *Attorney, Agent, or Firm* — Frommer Lawrence & Haug LLP; Ronald R. Santucci

(57) ABSTRACT

Method for calibration of an electrochemical accumulator, characterized in that it comprises a phase (P2) for modelling the energy ($E_d$) available in the electrochemical accumulator representing the energy that would be obtained when the accumulator is completely discharged based on a given discharge power and on a given initial state of energy.

15 Claims, 3 Drawing Sheets

(56) References Cited

U.S. PATENT DOCUMENTS

| | | | | |
|---|---|---|---|---|
| 6,160,380 | A * | 12/2000 | Tsuji et al. | 320/132 |
| 6,300,763 | B1 * | 10/2001 | Kwok | 324/427 |
| 2008/0215266 | A1 * | 9/2008 | Mizuno et al. | 702/63 |
| 2009/0053604 | A1 * | 2/2009 | Kato et al. | 429/223 |

OTHER PUBLICATIONS

Durr, Matthias et al.: "Dynamic model of a lead acid battery for use in a domestic fuel cel system", *Journal of Power Sources*, 161 (2006), pp. 1400-1411.

* cited by examiner

METHOD FOR CALIBRATING AN ELECTROCHEMICAL BATTERY

This application is a 371 of PCT/EP2010/059287 filed on Jun. 30, 2010, published on Jan. 6, 2011 under publication number WO 2011/000872, which claims priority benefits from French Patent Application Number 09/03258 filed Jul. 1, 2009, the disclosure of which is incorporated herein by reference.

The invention relates to a method for calibration of an electrochemical accumulator, together with a method for estimating the energy available within such an accumulator. It also relates to any device or system incorporating an electrochemical accumulator whose management is based on the preceding calibration method.

In order to control the operation of any device or system incorporating at least one electrochemical accumulator, it is essential to know and to be able to control the performance parameters of such an accumulator, in order to notably manage its charging and discharging phases and, in the end, optimize the operation of the device or of the system. It is indeed advantageous to know, at any moment in time, the state of the accumulator and to be able to forecast whether its energy reserves are sufficient to supply a given power demand. This therefore requires the knowledge of the available energy in a dynamic manner.

One conventional approach of the prior art consists, on the one hand, in studying the current that the accumulator can supply and, on the other hand, in estimating, in a decoupled manner, its output voltage, in order to deduce its power from these by the product of the current and the voltage.

In this conventional approach, the Peukert law is applied, allowing the capacity $C_{td\_mes}$ of the accumulator to be determined in Ampère-hours, which corresponds to the quantity of charge able to be supplied for a time $t_{d\_mes}$ until it is completely discharged, as a function of the imposed constant discharge current $I_{d\_imp}$, of the measured discharge time $t_{d\_mes}$, as a function of a constant K and of the Peukert coefficient n, according to the following equation:

$$C_{td\_mes} = t_{d\_mes} \times I_{d\_imp} = K/(I_{d\_imp})^{n-1}$$

Subsequently, this conventional approach is completed by the estimation of the state of charge of the accumulator, commonly denoted more simply as SOC. This SOC parameter represents the available capacity of the accumulator on a scale of 0 to 100%. The value of SOC is established and known for various imposed discharge regimes, throughout the life of the accumulator. For this purpose, iterative algorithms based on the Peukert law are designed to take into account the various factors such as the aging of the accumulator and the temperature. This approach is, in practice, very difficult and imprecise because many factors influence the SOC. In addition, the Peukert coefficient n also requires a high precision, of the order of $10^{-3}$, in order to approach satisfactory results, which demands complex and very precise experiments.

In parallel, it is necessary to predict the variations in the voltage over time across the terminals of the accumulator. This estimation is carried out by calculation using a model.

Finally, the product of the discharge current and the voltage allows access to the discharge power of the accumulator, whose integration over time allows the available energy to be deduced.

FIG. 1 represents such a conventional approach, in which an accumulator 1 is, on the one hand, studied by a first approach A1 comprising the study of its output current, the determination of the Peukert law and the state of charge SOC, then by a second approach A2 allowing its electrical characterization to be determined in order to model its voltage. Finally, in a last block 2, its available energy for various discharge powers can be calculated.

As has previously been made clear, the approach of the prior art is very complex to implement and therefore unsatisfactory. It leads to a poor control of systems incorporating one or more electrochemical accumulator(s).

Thus, one general aim of the invention is to provide another solution for determining the available energy of an electrochemical accumulator.

For this purpose, the invention is based on a method for calibration of an electrochemical accumulator, characterized in that it comprises a phase for modelling the energy $E_d$ available in the electrochemical accumulator representing the energy that would be obtained when the accumulator is completely discharged based on a given discharge power and on an initial state of energy. The calibration method also comprises a first phase of measurements of at least one value of available energy $E_d$, comprising a first step for determining at least one value of discharge power $P_d$ and a second step for determining at least one value of initial state of energy $SOE_0$ for which calibration measurements of the available energy are to be carried out.

The calibration method can also comprise a step for measurement of the value of energy available in the electrochemical accumulator comprising the implementation of the following sub-steps:

charging to full charge of the accumulator;
discharge of the accumulator at constant power, equal to the predetermined nominal power $P_N$ of the accumulator, until a discharged energy defined by the value $(1-SOE_0) \cdot E_N$ is reached, where $E_N$ corresponds to the nominal energy of the accumulator;
total discharge of the accumulator at constant power equal to a chosen discharge power $P_d$ of the accumulator;
measurement of the total discharged energy $E_d$ during the preceding step, either directly or based on the discharge time.

The first phase of measurement of at least one value of available energy $E_d$ can comprise a first step for determining a number $n_p$ of values of discharge power $P_{di}$ greater than one and a second step for determining a number $n_{soe}$ of values of initial states of energy $SOE_{0j}$ greater than one, and can comprise a selection of all or a part of the $n_p * n_{soe}$ pairs $(P_{di}; SOE_{0j})$ for which calibration measurements of the available energy $E_{dij}$ are to be carried out.

The number $n_p$ of values of discharge power $P_{di}$ can be in the range between 5 and 15 and the number $n_{soe}$ of values of initial state of energy $SOE_{0j}$ can be in the range between 4 and 12.

The various values of discharge power $P_{di}$ determined can be included in a range of power of use of the electrochemical accumulator, including a predetermined nominal power $P_N$, and these various values of power can be distributed uniformly or distributed non-uniformly, and be greater in number towards the high and/or the low values.

The method for calibration of an electrochemical accumulator can comprise a step for measurements of values of energy available in the electrochemical accumulator comprising the implementation of the following sub-steps, repeated successively for each of the $n_{soe}$ chosen values of initial state of energy $SOE_{0j}$:

charging to full charge of the accumulator;
discharge of the accumulator at constant power, equal to the predetermined nominal power $P_N$ of the accumulator, until a discharged energy defined by the value (1−SOE$_{0j}$). E$_N$ is reached, where E$_N$ corresponds to the nominal energy of the accumulator;

total discharge of the accumulator at constant power equal to a chosen discharge power P$_{di}$ of the accumulator;

measurement of the total discharged energy E$_{dij}$ during the preceding step, either directly or based on the discharge time;

and, the preceding sub-steps can be iterated until the measurement is reached for all the predefined n$_p$ values of discharge power P$_{di}$, before the re-iteration for a new value of initial state of energy SOE$_{0j+1}$.

The calibration method can comprise a relaxation period of at least ten minutes between the first two sub-steps then after the last sub-step.

The calibration method can comprise a fourth step for determining additional values of available energy associated with additional values of pairs of discharge power and initial state of energy (Pd; SOE$_0$) of the accumulator deduced from the measured values by extrapolation/interpolation during the phase (P2) for modelling the available energy.

The calibration method can comprise a calculation of available energy E$_d$ at a given discharge power P$_d$ for an initial state of energy SOE$_0$ of the accumulator by means of a regression of the exponential or power type, according to the formula:

$$E_{d\,SOEoj} = a_j + b_j \cdot \exp(-\tau_j P_d) \text{ where } a_j, b_j, \tau_j \text{ are exponential regression parameters,}$$

or according to the formula $$E_{d\,SOEoj} = K_j/P_d^{(nj-1)} \text{ where } K_j \text{ and } n_j (n_j > 1) \text{ are parameters for a regression of the power type.}$$

The method can comprise a calculation of an available energy E$_d$ at the initial state of energy SOE$_0$ by a linear regression, or regression in linear sections, using the parameters of the exponential or power type of the preceding regression as a function of the initial state of energy.

The calibration method can establish the calculation of the available energy E$_d$ of an accumulator as a function of the discharge power P$_d$ and of the initial state of energy SOE$_0$ by the following formula:

$$E_d = a_j(SOE_0) + b_j(SOE_0) \cdot \exp[-\tau_j(SOE_0)P_d]$$

where a$_j$, b$_j$, τ$_j$ are linear functions, or functions in linear sections, depending on the initial state of energy SOE$_0$.

The invention also relates to a method for estimating the available energy of an electrochemical accumulator, characterized in that it comprises the application of the calibration method such as previously defined.

The invention also relates to a device comprising at least one electrochemical accumulator, characterized in that it comprises a means for estimating the available energy implementing a method such as described hereinabove.

These subjects, features and advantages of the present invention will be presented in detail in the following description of one particular embodiment, and by way of non-limiting example in relation to the appended figures, amongst which:

The invention is based on the concept of evaluating the quantity of available energy in an electrochemical accumulator directly, without decoupling the current and the voltage.

Figure 1:
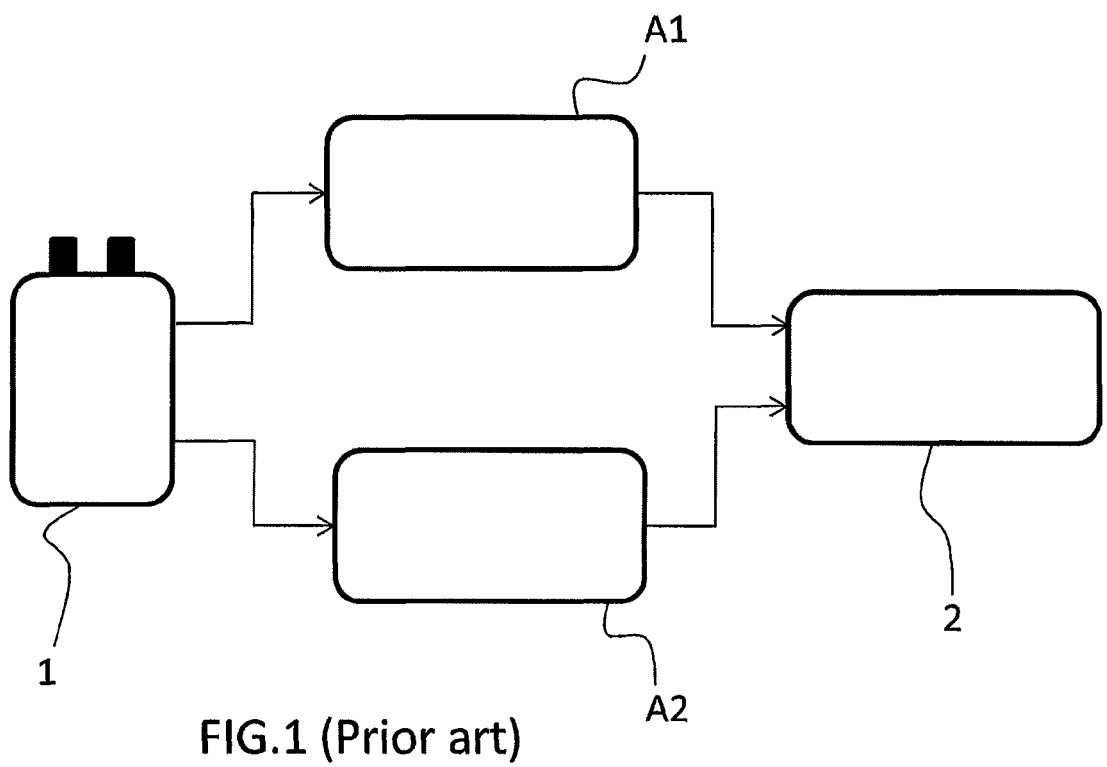
FIG. 1 shows schematically the method for evaluation of the available energy in an electrochemical accumulator according to the prior art.
Figure 2:
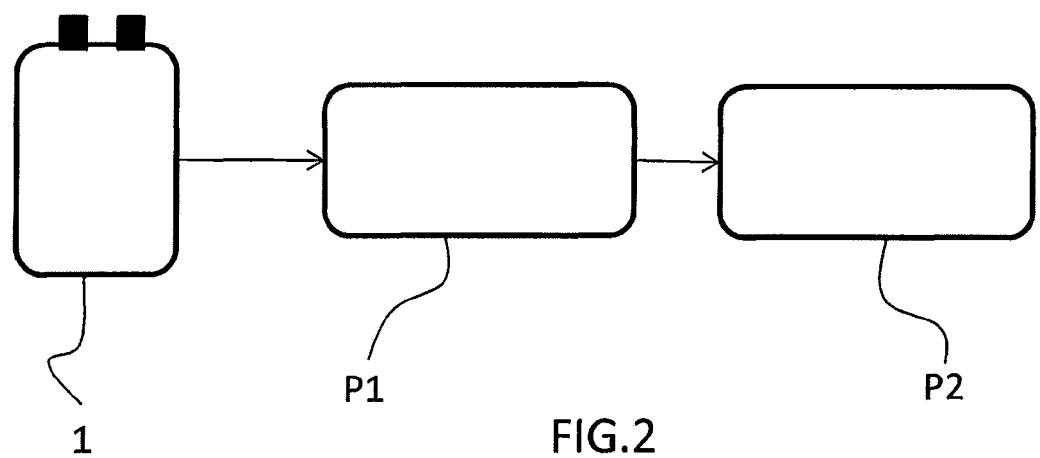
FIG. 2 shows schematically the method for evaluation of the available energy in an electrochemical accumulator according to the invention.

For this purpose, the invention is based on a method for calibration of an electrochemical accumulator 1, which allows the available energy for a predefined constant discharge power and for a given state of charge to be determined, according to an approach combining a first phase P1 of measurements of energy and a second phase P2 for modelling the available energy allowing an estimation serving as a calibration to be deduced from this, without direct measurement, as is shown schematically in FIG. 2.

Before detailing the significant steps of one embodiment of the invention, a few definitions should first of all be provided.

Firstly, a nominal power or energy of the accumulator can be defined according to the two following approaches:

the nominal power P$_N$ falls in a range of power of use recommended by the manufacturer of the accumulator, either directly supplied by this manufacturer or deduced, for example, from a current range supplied by this manufacturer, by multiplication by a nominal voltage supplied; or, the nominal power P$_N$ must allow discharges to be carried out that are as reproducible as possible according to the tested technology. For example, this objective can be attained by deducing the nominal power P$_N$ from the nominal capacity C$_N$ and from the nominal voltage U$_N$, by the formula P$_N$=C$_N$·U$_N$/N, N being the duration of the discharge (in number of hours).

This nominal power P$_N$ allows a nominal energy E$_N$ to be determined that is defined by the energy delivered by the accumulator when it is discharged at constant nominal power P$_N$ from full charge down to a completely discharged state, over a nominal period of time t$_N$: these data characterize the nominal discharge regime.

The charged and discharged states are determined according to the technology of the accumulator. They can be obtained from the recommendations of the manufacturer of the accumulator, and are generally based on threshold voltages.

Lastly, a "state of energy", or SOE, is defined as the ratio between the energy E$_{d/PN}$ available with the assumption of a discharge of energy under the nominal conditions of the accumulator and the nominal energy E$_N$, hence defined by the formula SOE=E$_{d/PN}$/E$_N$. This value of SOE is in the range between 0 and 1, the value equal to 1 corresponding to a totally charged state of energy of the accumulator and the value equal to 0 as a totally discharged state.

The method for calibration in power of the invention comprises a first step E1 for characterization of an electrochemical accumulator 1 in power. This step comprises the determination of several discharge powers P$_{di}$ within the range of power of operation of the accumulator, hence including the nominal power P$_N$. The number n$_p$ of these discharge powers must represent a good compromise between the requirement to obtain a sufficient number of measured values over discharge phases of the accumulator according to these various discharge powers P$_{di}$, where i varies from 1 to n$_p$, as will be made clear in the following part, and the requirement not to wear out the accumulator so as not to adversely affect further measurements. Advantageously, this number n$_p$ of chosen discharge powers will be in the range between 5 and 15, these values being included. These various powers P$_{di}$ may be chosen according to a uniform distribution over the whole range of use of the accumulator or in a non-uniform manner, in order to study the behaviour towards the higher and/or the lower powers in more detail.

The method of the invention comprises a second step E2 for determining several values of $SOE_{0j}$, between 0 and 1, representing several states of charge of the accumulator in energy. The number $n_{soe}$ of these chosen values also represents a good compromise in order to obtain a sufficient number of values so as to calibrate the accumulator correctly without however causing its premature aging. A number in the range between 4 and 12 inclusive is advantageous.

The method of the invention subsequently comprises the implementation of a third step E3 with charging/discharging cycles for each of the given values of discharge power $P_{di}$ and for each of the given values of SOE $SOE_{0j}$, according to finally a number $n_p*n_{soe}$ of possible combinations. For each pair of these values ($P_{di}$, $SOE_{0j}$), an energy $E_{dij}$ available within the accumulator is established in the case of a discharge at constant power $P_{di}$ starting from an initial state $SOE_{0j}$.

Figure 3:
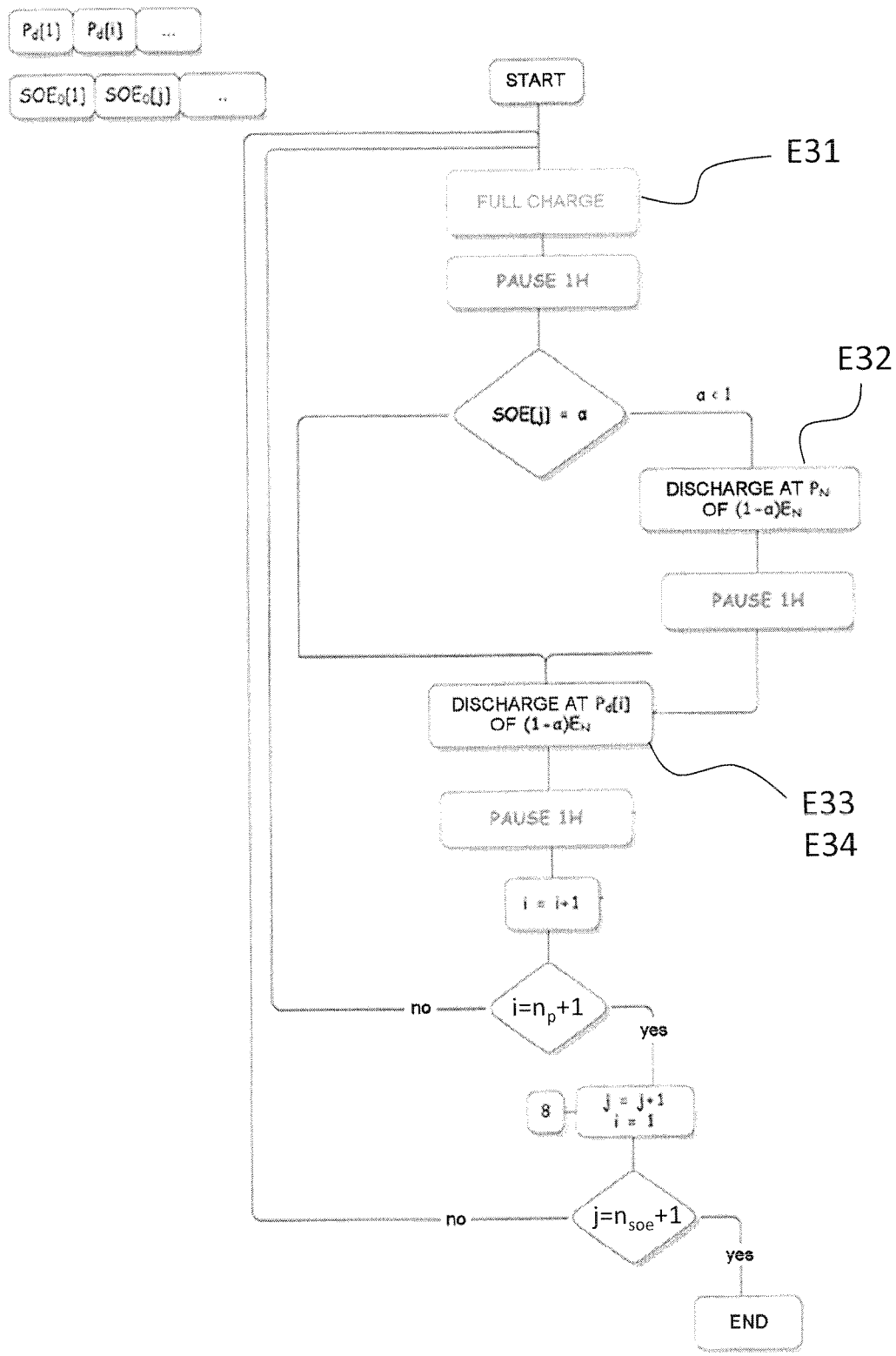
FIG. 3 shows a method for measurements of calibration values according to the embodiment of the invention.

According to the embodiment of the invention, this measurement step E3, illustrated in FIG. 3, comprises the implementation of the following steps, repeated successively for each of the $n_{soe}$ values $SOE_{0j}$ (for j varying from 1 to $n_{soe}$):
E31: charging to full charge of the accumulator, according to a procedure recommended by the manufacturer and/or the best adapted to the technology of the accumulator in question;
E32: discharge at constant power equal to the nominal power $P_N$ of the accumulator until a discharged energy defined by $(1-SOE_{0j}) \times E_N$ is reached, allowing it to be brought to the initial state $SOE_{0j}$;
E33: total discharge of the accumulator at constant power equal to $P_{di}$;
E34: measurement of the total discharged energy during the preceding step, either directly or indirectly such as, for example, based on discharge time.

The steps E31 to E34 are iterated successively for each of the $n_p$ chosen values $P_{di}$ (for i varying from 1 to $n_p$). Between the steps E31 and E32 then after the step E34, a sufficient relaxation period, of at least 10 minutes, is applied. Subsequently, the whole iteration is done again for a next value $SOE_{0j+1}$. For example, the relaxation period will be equal to 10 minutes for a Li-ion battery and greater than one hour for a lead battery.

The method then comprises a last calculation step E4 for deducing other calibration values from the previously measured values, as for obtaining the available energy $E_d$ or the state of energy all the way along a power profile imposed on the accumulator.

The preceding algorithm has been illustrated by a double iteration, each of the $n_p$ values $P_{di}$ being iterated for each of the $n_{soe}$ values $SOE_{0j}$. The double iteration could of course be carried out in a similar manner by imposing each of the $n_{soe}$ values $SOE_{0j}$ being iterated for each of the $n_p$ values $P_{di}$. According to another alternative, all of these $n_p*n_{soe}$ possible combinations can be obtained in any given order, organized or otherwise. It should be clearly noted that these $n_p*n_{soe}$ pairs may have regular or irregular steps.

According to one variant embodiment, the preceding algorithm could be implemented without taking into account all the $n_p*n_{soe}$ pairs but a chosen sample. For example, in certain areas where the battery exhibits a stable behaviour, it would be possible to only carry out the measurement for one out of two or three steps, and to perform more measurements in more problematic areas of operation of the battery, i.e. for all the pairs of values in these areas.

The values sought may be obtained by any kind of modelling and, based on the measured values, by extrapolation or interpolation or by any mathematical processing operation.

Figure 4:
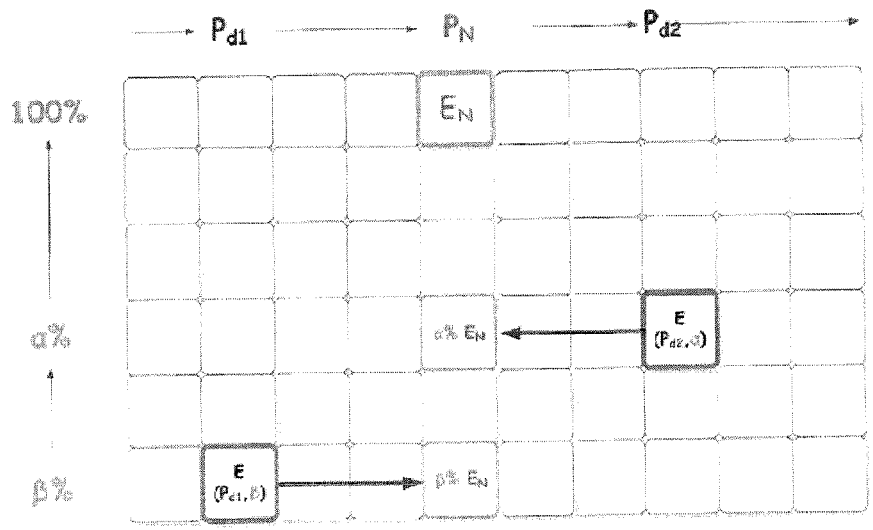
FIG. 4 shows a method of extrapolation using measured values according to the embodiment of the invention.

By way of advantageous example, an extrapolation using an explicit mathematical relationship between the available energy $E_d$, the discharge power $P_d$ and the state of energy $SOE_0$ is implemented based on a regression. FIG. 4 illustrates this principle.

For this purpose, in the case of a Lithium-ion accumulator, the dependency of the available energy $E_d$ at the discharge power Pd is dissociated from the energy $E_d$ available at the initial state of energy.

Thus, it is possible to establish a first dependency of the energy $E_d$ at the discharge power $P_d$ for each state of charge $SOE_{0j}$ by means of a regression of the exponential or power type.

For example, this regression may be written as the following formula of the exponential type:

$E_{d\,SOE_{0j}} = a_j + b_j \exp(-\tau_j P_d)$ where $a_j, b_j, \tau_j$ are the parameters of the exponential regression.

As a variant, the regression may be written as the following formula of the power type:

$E_{d\,SOE_{0j}} = K_j/P_d^{(n_j-1)}$ where $K_j$ and $n_j(n_j>1)$ are the parameters of the regression in power.

The second dependency of the energy $E_d$ at the initial state $SOE_0$ may be expressed by linear regressions, or regressions in linear sections, using the parameters of the preceding regression as a function of the initial state of energy. Thus, in the case of the exponential regression previously envisaged with regard to the first dependency of the energy $E_d$, the parameters $a_j, b_j, \tau_j$ may be expressed in the following linear manner:

$a_j = \alpha_a \times SOE_0 + \beta_a$ $b_j = \alpha_b \times SOE_0 + \beta_b$ $\tau_j = \alpha_\tau \times SOE_0 + \beta_\tau$ with $\alpha_a, \beta_a, \alpha_b, \beta_b, \alpha_\tau, \beta_\tau$ as parameters of the linear regressions.

Thus, a regression allowing an analytical relationship of the available energy to be established as a function of the discharge power and of the initial state, for a Lithium-ion accumulator, can be:

$E_d = a_j(SOE_0) + b_j(SOE_0) \cdot \exp[-\tau_j(SOE_0) P_d]$ where $a_j, b_j, \tau_j$ are linear functions, or functions in linear sections, dependent on the initial state of energy.

Figure 5:
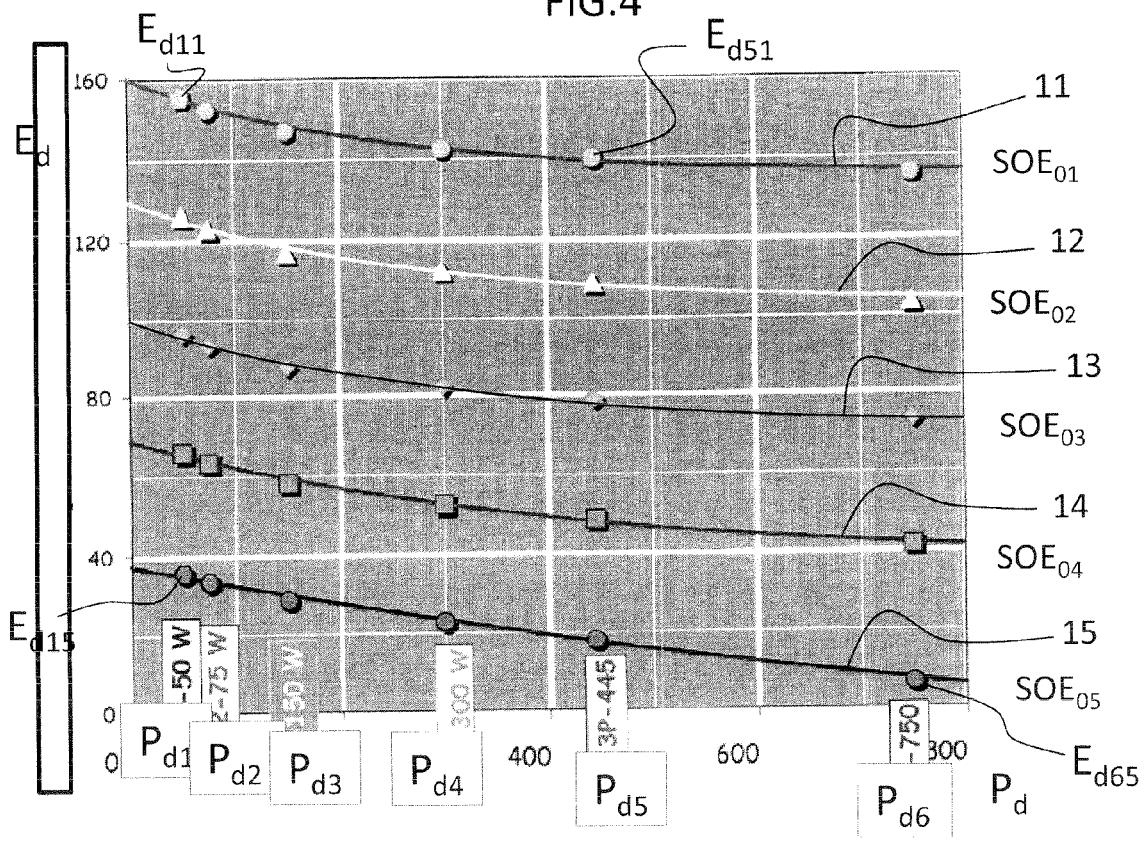
FIG. 5 shows calibration values representing the available energy as a function of the discharge power for several values of initial state according to the embodiment of the invention.

FIG. 5 shows one example of this implementation with an exponential regression according to the discharge power $P_d$ shown on the abscissa and linear regressions according to $SOE_0$ for an accumulator of 3.7 V and of 147.1 Wh nominal ($P_N$=150 W). The points $E_{dij}$ represent the various values of energy coming from the experiments for various powers $P_{di}$ and based on various states of energy $SOE_{0j}$. N.B. in the example illustrated in FIG. 5, $n_p=6$ and $n_{soe}=5$, the graph shows, on the ordinate, the energy $E_d$ available for a given discharge power and the calibration method allows five curves 11 to 15 to be obtained respectively corresponding to state of energy values $SOE_{01}$ to $SOE_{05}$. These different curves are obtained by interpolation between the various measurement points of available energy $E_{dij}$ using models such as previously presented.

The preceding calibration method allows a method for estimating the available energy of an electrochemical accumulator to be implemented, for example by an iterative algorithm, when it is used in a system. The state of energy can be indicated during the use of the accumulator at an imposed power.

For this purpose, a system or a device incorporating such an accumulator may use software and/or hardware means, for example comprising a memory containing the calibration data defined by the preceding calibration method, and real-time calculations in order to know precisely the energy budget of the system or of the device. This approach is particularly advantageous for the applications of batteries for example on board an electric motor vehicle, or for an energy storage device connected to the network, or for any type of storage system subjected to power demands.

The concept of the invention is adapted to any electrochemical accumulator, lithium, or nickel, or lead for example, whether this be on the elementary accumulator (10 Wh), on series and/or parallel accumulator modules (100 Wh) or on complete systems of assembled modules, also in series and/or in parallel (of the order of kWh or even MWh).

The invention claimed is:

1. Method for calibration of an electrochemical accumulator, wherein it comprises a first phase of measurements of at least one value of available energy, comprising a first step for determining at least one value of discharge power and a second step for determining at least one value of initial state of energy ($SOE_0$) for which calibration measurements of the available energy are to be carried out, and in that it comprises a second phase for modelling the available energy of the electrochemical accumulator representing the energy that would be obtained when the accumulator is completely discharged based on a given discharge power selected from the at least one value of discharge power and on a given initial state of energy selected from the at least one value of initial energy, the calibration data corresponding to this modelling being stored in a memory of a device incorporating software and hardware means, wherein the first phase of measurements of at least one value of available energy comprises:
a first step for determining a number ($n_p$) of values of the discharge power greater than one and
a second step for determining a number ($n_{soe}$) of values of the initial states of energy greater than one, and
a third step for measurement of the value of available energy in the electrochemical accumulator comprising the implementation of the following sub-steps, repeated successively for each of the $n_{soe}$ chosen values of the initial state of energy:
a first sub-step of charging to full charge of the accumulator;
a second sub-step of discharging of the accumulator at a constant power equal to nominal power of the accumulator until a discharged energy defined by the value $(1-SOE_0) \cdot E_N$ is reached, where $E_N$ corresponds to the nominal energy of the accumulator,
a third sub-step of total discharge of the accumulator at constant power equal to the chosen discharge power of the accumulator;
a fourth sub-step of measuring the total energy discharged during the third sub-step, either directly or from the discharge time, said energy discharged corresponding to the available energy associated to the discharge power and to the given initial state of energy and memorization of such calibration data;
and in that the first to fourth sub-steps are iterated until the measurement is reached for all the predefined $n_p$ values of the discharge power, before the re-iteration for a new value of initial state of energy, wherein the number ($n_p$) of values of the discharge power means a number of different values of discharge power determined and the number ($n_{soe}$) of values of the initial states of energy means a number of different values of the initial states of energy determined.

2. Method for calibration of an electrochemical accumulator according to claim 1, wherein the number of values of discharge power ($P_{di}$) is in the range between 5 and 15 and in that the number of values of initial state of energy is in the range between 4 and 12.

3. Method for calibration of an electrochemical accumulator according to claim 1, wherein the various values of discharge power determined are included in a range of power of use of the electrochemical accumulator, including a predetermined nominal power, and in that these various power values are distributed uniformly or in that they are distributed non-uniformly, with a greater number towards the high and/or the low values.

4. Method for calibration of an electrochemical accumulator according to claim 1, wherein it comprises a relaxation period of at least ten minutes between the first sub-step and the second sub-step then after the fourth sub-step.

5. Method for calibration of an electrochemical accumulator according to claim 1, wherein it comprises a fourth step for determining additional values of available energy associated with additional values of pairs of discharge power and initial state of energy of the accumulator deduced from the measured values by extrapolation or interpolation during the second phase for modelling the available energy.

6. Method for calibration of an electrochemical accumulator according to claim 5, wherein it comprises a calculation of available energy ($E_d$) at a given discharge power ($P_d$) for an initial state of energy ($SOE_0$) of the accumulator by means of a regression of the exponential or power type, according to the formula:

$$E_{d\ SOEoj} = a_j + b_j \cdot \exp(-\tau_j P_d) \text{ where } a_j, b_j, \tau_j \text{ are exponential regression parameters,}$$

or according to the formula $$E_{d\ SOEoj} = K_j / P_d^{(nj-1)} \text{ where } K_j \text{ and } n_j (n_j > 1) \text{ are parameters for a regression of the power type.}$$

7. Method for calibration of an electrochemical accumulator according to claim 6, wherein it comprises a calculation of available energy at the initial state of energy by a linear regression, or regression in linear sections, using the parameters of the exponential or power type of the preceding regression as a function of the initial state of energy.

8. Method for calibration of an electrochemical accumulator according to claim 7, wherein it establishes the calculation of the available energy of an accumulator as a function of the discharge power and of the initial state of energy by the following formula:

$$E_d = a_j(SOE_0) + b_j(SOE_0) \cdot \exp[-\tau_j(SOE_0) P_d]$$

where $a_j$, $b_j$, $\tau_j$ are linear functions, or functions in linear sections, depending on the initial state of energy.

9. Method for estimating the available energy of an electrochemical accumulator, wherein it comprises the application of the calibration method according to claim 1.

10. Device comprising at least one electrochemical accumulator, wherein it comprises a means for estimating the available energy implementing a method according to claim 9.

11. Method for calibration of an electrochemical accumulator according to claim 2, wherein the various values of discharge power determined are included in a range of power of use of the electrochemical accumulator, including a predetermined nominal power, and in that these various power values are distributed uniformly or in that they are distributed non-uniformly, with a greater number towards the high and the low values.

12. Method for calibration of an electrochemical accumulator according to claim 1, wherein it comprises a fourth step for determining additional values of available energy associated with additional values of pairs of discharge power and initial state of energy of the accumulator deduced from the measured values by extrapolation or interpolation during the second phase for modelling the available energy.

13. Method for calibration of an electrochemical accumulator according to claim 1, wherein the various values of discharge power determined are included in a range of power of use of the electrochemical accumulator, including a predetermined nominal power, and in that these various power values are distributed uniformly or in that they are distributed non-uniformly, with a greater number towards the high and the low values.

14. Method for calibration of an electrochemical accumulator according to claim 4, wherein the method comprises a fourth step for determining additional values of available energy associated with additional values of pairs of discharge power and initial state of energy of the accumulator deduced from the measured values by extrapolation or interpolation during the second phase for modelling the available energy.

15. Method for estimating the available energy of an electrochemical accumulator, wherein it comprises the application of the calibration method according to claim 8.

* * * * *